United States Patent
Ryu

(10) Patent No.: US 8,739,729 B2
(45) Date of Patent: Jun. 3, 2014

(54) CHEMICAL LIQUID SUPPLY UNIT, AND SUBSTRATE TREATING APPARATUS AND METHOD USING THE SAME

(75) Inventor: In-Cheol Ryu, Jeongeup-si (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 1263 days.

(21) Appl. No.: 12/289,752

(22) Filed: Nov. 3, 2008

(65) Prior Publication Data

US 2009/0169758 A1   Jul. 2, 2009

(30) Foreign Application Priority Data

Dec. 27, 2007   (KR) .......................... 10-2007-138664

(51) Int. Cl.
  *B05B 15/02*   (2006.01)
  *B05C 5/00*   (2006.01)
  *B05B 7/00*   (2006.01)
  *B05B 3/18*   (2006.01)
  *B05C 11/08*   (2006.01)

(52) U.S. Cl.
  USPC ........... 118/302; 118/313; 118/321; 118/323; 134/167 C; 134/902; 239/106; 239/110; 427/240

(58) Field of Classification Search
  CPC .... B05D 1/005; B05B 15/0258; B05C 11/08; H01L 21/6715; H01L 21/67051
  USPC .......... 118/302, 313, 321, 323; 239/106, 110; 134/167 C, 902; 427/240
  See application file for complete search history.

(56) References Cited

U.S. PATENT DOCUMENTS

| | | | |
|---|---|---|---|
| 5,002,008 A * | 3/1991 | Ushijima et al. ............... | 118/313 |
| 5,772,764 A | 6/1998 | Akimoto | |
| 5,938,847 A * | 8/1999 | Akimoto et al. .............. | 118/665 |
| 6,418,946 B1 * | 7/2002 | Marinaro et al. ......... | 134/166 R |
| 6,494,953 B2 * | 12/2002 | Hayes et al. ..................... | 118/52 |
| 7,479,190 B2 * | 1/2009 | Fukuda et al. ................ | 118/698 |
| 2003/0059534 A1 * | 3/2003 | Nishijima et al. ............ | 427/240 |
| 2003/0138551 A1 * | 7/2003 | Miyata .......................... | 118/663 |
| 2006/0121741 A1 | 6/2006 | Park | |
| 2006/0233952 A1 * | 10/2006 | Nakashima et al. .......... | 118/313 |
| 2008/0023034 A1 * | 1/2008 | Hirao et al. ..................... | 134/11 |

FOREIGN PATENT DOCUMENTS

| | | |
|---|---|---|
| JP | 63-301520 | 12/1988 |
| JP | 10-256127 | 9/1998 |
| JP | 3327642 | 9/2001 |
| JP | 2003-062504 | 3/2003 |
| JP | 2003-178965 | 6/2003 |
| JP | 2006-302934 | 11/2006 |
| JP | 2007-324393 | 12/2007 |
| KR | 1019990013579 | 2/1999 |
| KR | 2003-000800 | 1/2003 |
| KR | 1020060063340 | 6/2006 |

* cited by examiner

*Primary Examiner* — Dah-Wei D Yuan
*Assistant Examiner* — Binu Thomas
(74) *Attorney, Agent, or Firm* — Harness, Dickey & Pierce, P.L.C.

(57) ABSTRACT

Provided are a substrate treating unit, and substrate treating apparatus and method using the same. Two nozzle arms are provided, and photoresist liquid nozzles and an organic solvent nozzle are installed in each of the nozzle arms. A temperature of a photoresist liquid flowing into the photoresist liquid nozzles and a temperature of an organic solvent flowing into the organic solvent nozzle are maintained by a temperature control fluid supplied through the same passage. Also, a waiting port in which a nozzle arm used in a process temporarily waits is provided. The organic solvent is provided to a photoresist liquid nozzle that is not used in a process and is not provided to a photoresist liquid nozzle used in the process.

13 Claims, 17 Drawing Sheets

CHEMICAL LIQUID SUPPLY UNIT, AND SUBSTRATE TREATING APPARATUS AND METHOD USING THE SAME

CROSS-REFERENCE TO RELATED APPLICATIONS

This U.S. non-provisional patent application claims priority under 35 U.S.C. §119 of Korean Patent Application No. 10-2007-0138664, filed on Dec. 12, 2007, the entire contents of which are hereby incorporated by reference.

BACKGROUND OF THE INVENTION

The present invention disclosed herein relates to a substrate treating apparatus and method, and more particularly, to a chemical liquid supply unit supplying a photoresist liquid onto a substrate, a substrate treating apparatus including the same, and a substrate treating method using the same.

Semiconductor devices are manufactured by repeatedly performing a process of sequentially stacking thin films on a silicon wafer to form a predetermined circuit pattern. In order to form and stack the thin films, a plurality of unit processes such as a deposition process, a photolithography process, and an etching process must be repeatedly performed.

The photolithography process is a process for forming the patterns on the wafer. The photolithography process includes coating, exposing, and developing processes.

In the coating process, the photoresist liquid that is a material sensitive to light is uniformly coated on a surface of the wafer. In the exposing process, light passes through the circuit patterns drawn on a mask using a stepper to expose the wafer including the photoresist liquid. The developing process is selectively performed on a portion in which the light is received or a portion in which the light is not received on a photoresist film of a surface of the wafer through the exposing process using a developer.

The coating, exposing, and developing processes are performed to form the patterns on the wafer. A top layer of the wafer can be etched using the patterns formed on the wafer to form the devices corresponding to the patterns.

Kinds of photoresist liquid supplied to the wafer are different according to the processes. Thus, a large number of photoresist liquid supply nozzles are disposed in a coating device. Also, a transfer arm for selectively holding and transferring the photoresist liquid supply nozzles to be used in the processes is disposed in the coating device. However, since such a typical device must have a structure in which the photoresist liquid supply nozzles are detachable, a constitution of the device is complicated, and portions of the photoresist liquid supply nozzles are changed during the detachment and movement thereof.

SUMMARY OF THE INVENTION

The present invention provides a chemical liquid supply unit that can effectively perform a photoresist liquid coating process and a substrate treating apparatus and method using the same.

The present invention also provides a chemical liquid supply unit in which constitutions of a unit and device for coating chemical liquid can be simplified and a substrate treating apparatus and method using the same.

The present invention, however, should not be construed as limited thereto, and those skilled in the art may easily understand other advantages and performance of the present invention through the following detailed description.

Embodiments of the present invention provide chemical liquid supply units including a plurality of nozzles discharging a chemical liquid; a nozzle arm in which the plurality of nozzles is installed and chemical liquid tubes supplying the chemical liquid to the nozzles are built; and a temperature control member supplying a temperature control fluid into the nozzle arm to control temperature of the chemical liquid flowing through the chemical liquid tubes.

In some embodiments, the temperature control member may include: a temperature control fluid discharging tube communicating with a space between an inside wall of a body of the nozzle arm and the chemical liquid tubes; a temperature control fluid supply line supplying the temperature control fluid to the space between the inside wall of the body and the chemical liquid tubes; and a temperature control fluid discharging line connected to the temperature control fluid discharging tube.

In other embodiments, the temperature control member may include: a temperature control fluid supply tube surrounding the chemical liquid tubes inside the nozzle arm; a temperature control fluid discharging tube surrounding the temperature control fluid supply tube inside the nozzle arm, the temperature control fluid discharging tube communicating with the temperature control fluid supply tube; a temperature control fluid supply line connected to the temperature control fluid supply tube; and a temperature control fluid discharging lien connected to the temperature control fluid discharging tube.

In still other embodiments, the plurality of nozzles may include photoresist liquid nozzles discharging a photoresist liquid, and the chemical liquid tubes may include photoresist liquid tubes supplying the photoresist liquid to the photoresist liquid nozzles. The plurality of nozzles may further include an organic solvent nozzle discharging an organic solvent for performing a pre-wet process, and the chemical liquid tubes may further include an organic solvent tube supplying the organic solvent to the organic solvent nozzle. The chemical liquid supply unit may further include: an organic solvent supply line connecting an organic solvent source to the organic solvent tube; and a suction member disposed in the organic solvent supply line, the suction member providing a negative pressure to the organic solvent nozzle.

In other embodiments of the present invention, substrate treating apparatuses include a substrate support member supporting a substrate; a nozzle arm including a plurality of photoresist liquid nozzles discharging a photoresist liquid onto the substrate; and a waiting port in which the plurality of nozzles installed in the nozzle arm waits for performing processes, the waiting port being disposed at a side portion of the substrate support member, wherein the waiting port includes: a housing having an opened top portion, the housing providing a space for receiving the plurality of nozzles; and organic solvent supply members one-to-one corresponding to the plurality of the photoresist liquid nozzles received in the housing, the organic solvent supply members supplying an organic solvent to a front end of a photoresist liquid nozzle selected from the corresponding photoresist liquid nozzles.

In some embodiments, the housing may provide a nozzle receiving space having a recessed shape in which all of the plurality of photoresist liquid nozzles are received, and the organic solvent supply members may have organic solvent supply passages directly and independently supplying an organic solvent to front ends of the photoresist liquid nozzles.

In other embodiments, the housing may provide a plurality of nozzle receiving spaces having a recessed shape in which the plurality of photoresist liquid nozzles is separately received, and the organic solvent supply members may have organic solvent supply passages independently supplying the organic solvent to each of the nozzle receiving spaces. The housing may include a discharging line discharging the organic solvent stored in the nozzle receiving spaces. The substrate treating apparatus may further include an organic solvent nozzle installed in the nozzle arm and discharging an organic solvent for performing a pre-wet process, the housing may provide a plurality of nozzle receiving spaces having a recessed shape in which the plurality of photoresist liquid nozzles and the organic solvent nozzle are separately received, and the organic solvent supply members may have organic solvent supply passages independently supplying the organic solvent to each of the nozzle receiving spaces receiving the plurality of photoresist liquid nozzles.

In still other embodiments, the substrate treating apparatus may include a storage port disposed at a side of the waiting port, the storage port providing a space for storing the nozzles installed in the nozzle arm. The nozzle arm may be provided in plurality, and the waiting port and the storage port may be provided in plurality so that each port corresponds to each nozzle arm.

In even other embodiments, the storage port may include: a housing having an opened top portion, the housing providing a nozzle receiving space having a recessed shape for receiving the nozzles; an organic solvent supply member supplying the organic solvent to the nozzle receiving space.

In yet other embodiments, the waiting port and the storage port may make a pair, and the pair of ports may be separately disposed at both sides of the substrate support member so that the waiting port, the substrate support member, and the storage port may be arranged parallel to each other in a line, and the nozzle arms are separately disposed at both sides of the substrate support member so that the nozzle arms are perpendicular to the arrangement direction of the waiting port and the storage port.

In further embodiments, the substrate treating apparatus may further include a driving member moving the nozzle arms to position the nozzles provided in the nozzle arm into a processing position on the substrate support member, a waiting position provided in the waiting port, and a storage position provided in the storage port, wherein the driving member may include: nozzle arm support members supporting each of the nozzle arms; drivers straightly reciprocating the nozzle arm support members in a direction parallel to the arrangement direction of the waiting port and the storage port; and a guide member guiding the straight movement of the nozzle arm support member.

In still other embodiments of the present invention, substrate treating methods include supplying a photoresist liquid while a plurality of photoresist liquid nozzles is repeatedly moved between a position in which the photoresist liquid is supplied to a substrate and a waiting port using a nozzle arm including the plurality of photoresist liquid nozzles, wherein an organic solvent is supplied to a photoresist liquid nozzle that is not used in a process among the plurality of photoresist liquid nozzles in the waiting port, and the plurality of photoresist liquid nozzles waits in a state where the organic solvent is not supplied to a photoresist liquid nozzle used in the process.

In some embodiments, the wait of the photoresist liquid nozzles may be realized by providing a plurality of receiving spaces to the waiting port, waiting the photoresist liquid nozzle used in the process in a receiving space in which the organic solvent is not stored, and waiting the photoresist liquid nozzle that is not used in the process in a receiving space in which the organic solvent is stored.

In other embodiments, the wait of the photoresist liquid nozzles in the waiting port may be realized in a state where the organic solvent is sprayed to the photoresist liquid nozzle that is not used in the process among the photoresist liquid nozzles in the waiting port, and the organic solvent is not sprayed to the photoresist liquid nozzle used in the process.

In still other embodiments, the nozzle arm may be provided in plurality, and a nozzle arm that is not used in the process may be stored in the storage port maintained in an organic solvent atmosphere.

In even other embodiments, the nozzle arm may include a plurality of photoresist liquid tubes supplying the photoresist liquid to the photoresist liquid nozzle, and a temperature control fluid maintaining a temperature of the photoresist liquid flowing into the photoresist liquid tubes at a set temperature may be supplied to the nozzle arm, wherein the temperature of the photoresist liquid within the photoresist liquid tubes may be controlled by the temperature control fluid flowing into the same passage.

In yet other embodiments, the temperature control fluid may be supplied through a space between an inside wall of a body of the nozzle arm and the photoresist liquid tubes and discharged through a temperature control fluid discharging tube disposed inside the nozzle arm.

In further embodiments, an organic solvent nozzle discharging the organic solvent for a pre-wet process may be further installed in the nozzle arm, an organic solvent tube supplying the organic solvent to the organic solvent nozzle may be further provided in the nozzle arm, and the organic solvent flowing into the organic solvent tube may be maintained at the set temperature by the temperature control fluid flowing into the same passage.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to FIGS. 1 through 8. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
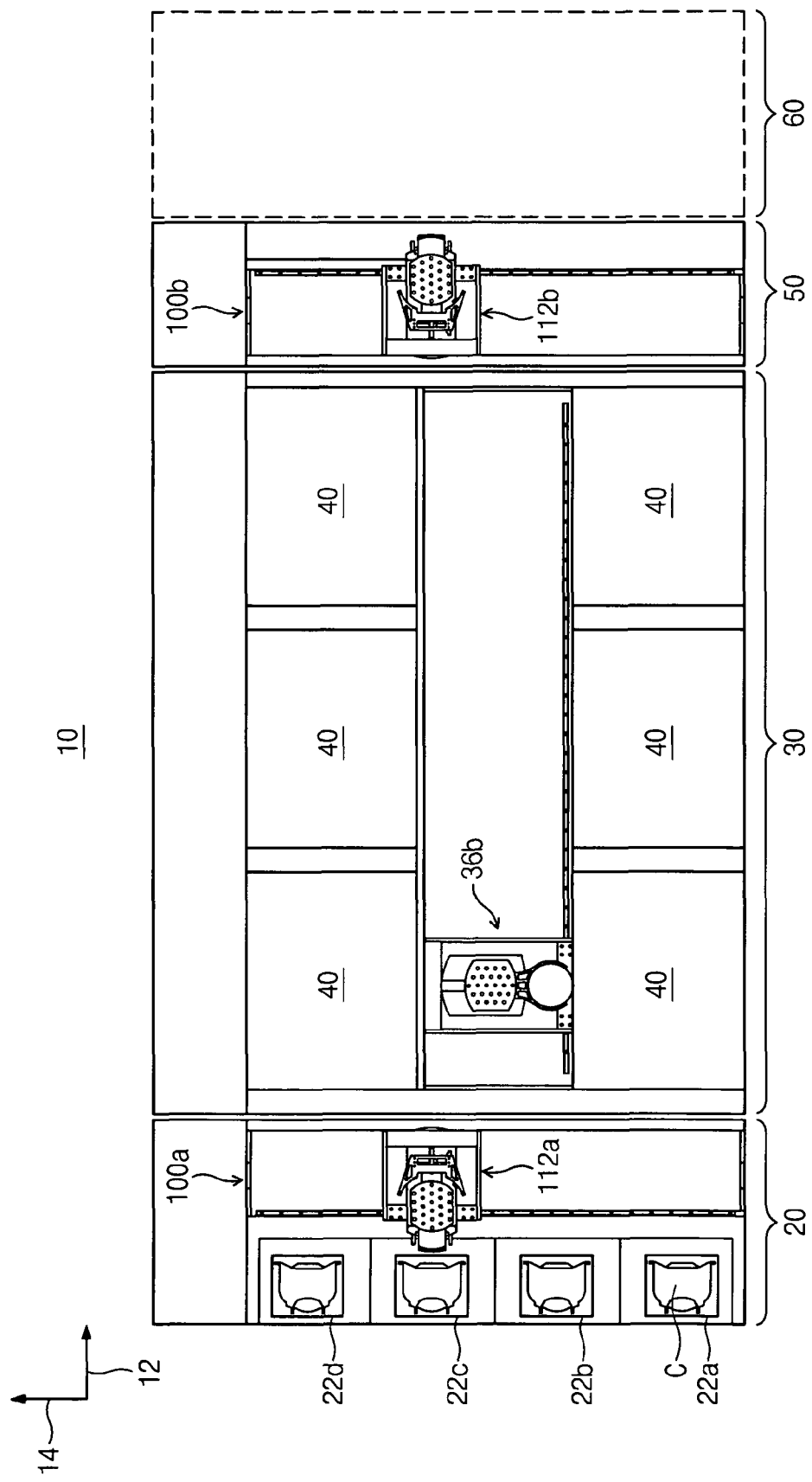
FIG. 1 is a plan view of a semiconductor manufacturing facility including a substrate treating apparatus according to an embodiment of the present invention.
Figure 2:
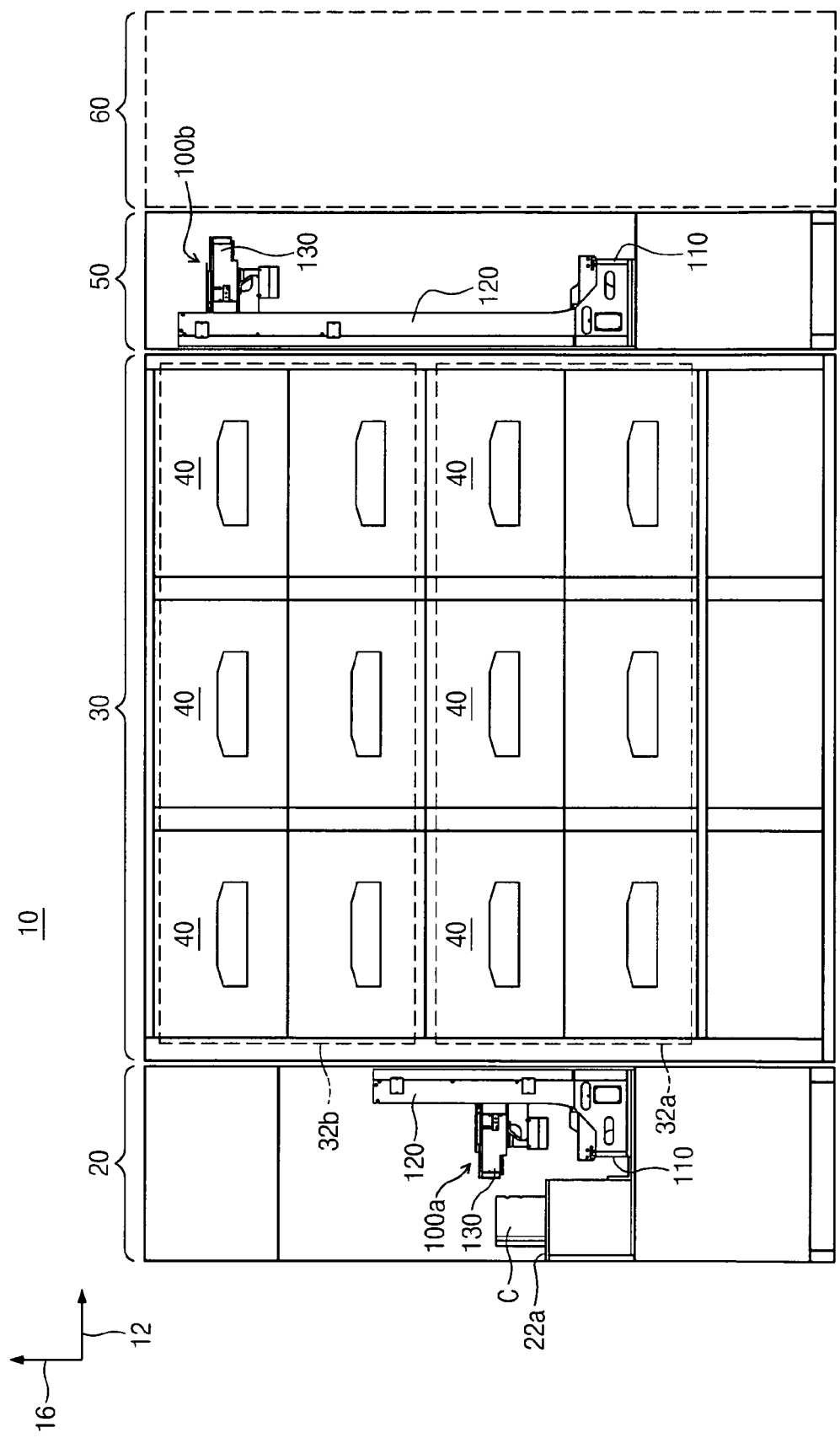
FIG. 2 is a side view illustrating the semiconductor manufacturing facility of FIG. 1.
Figure 3:
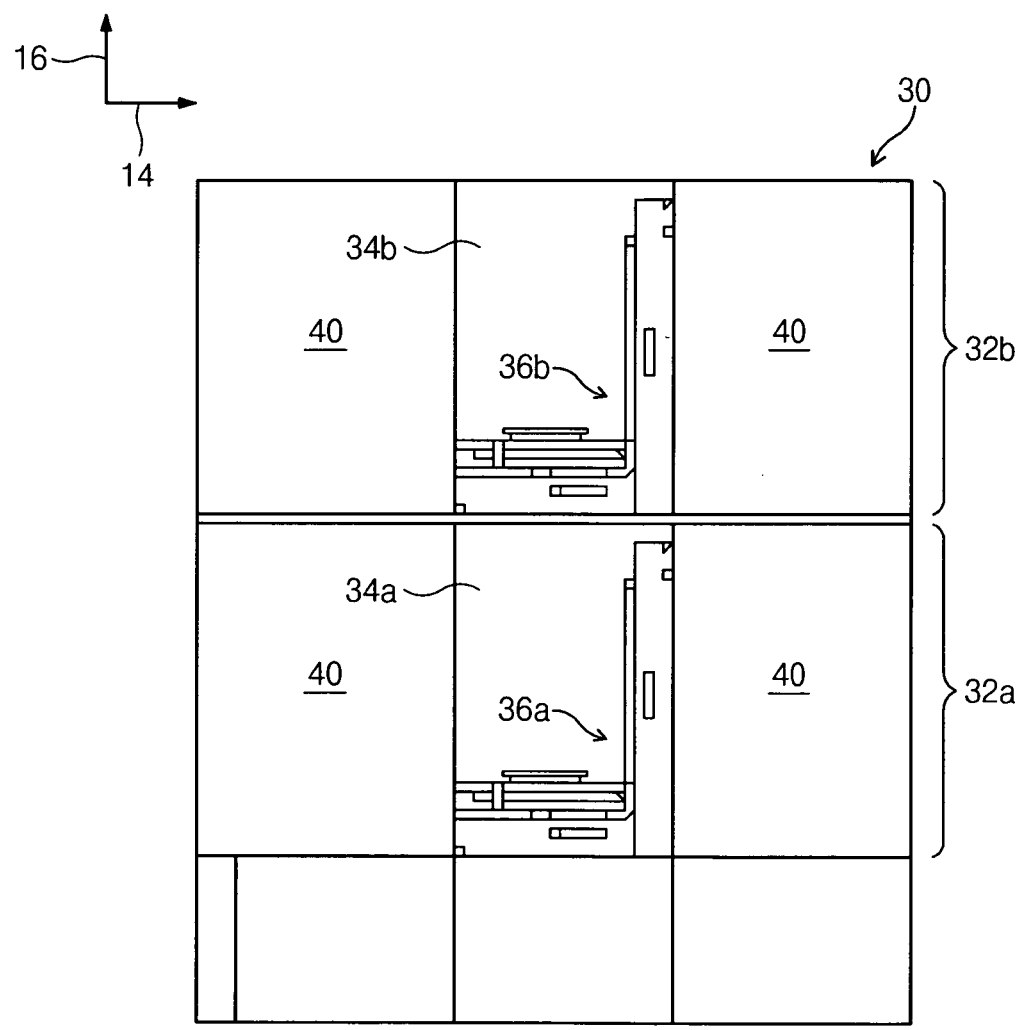
FIG. 3 is a view illustrating a processor of the semiconductor manufacturing facility of FIG. 1.

FIG. 1 is a plan view of a semiconductor manufacturing facility including a substrate treating apparatus according to an embodiment of the present invention, FIG. 2 is a side view illustrating the semiconductor manufacturing facility of FIG. 1, and FIG. 3 is a view illustrating a processor of the semiconductor manufacturing facility of FIG. 1.

Referring to FIGS. 1 through 3, a semiconductor manufacturing facility 10 includes an indexer 20, a processor 30, and an interface 50. The indexer 20, the processor 30, the interface 50 are parallelly disposed in a first direction 12. The indexer 20 is disposed adjacent to a front end of the processor 30 along the first direction 12. The interface 50 is disposed adjacent to a rear end of the processor 30 along the first direction 12. The indexer 20 and the interface 50 are disposed toward a second direction 14 perpendicular to the first direction 12 in length direction. The processor 30 has a multi-layer structure stacked in upward and downward directions. A first processing unit 32a is disposed in a lower layer, and a second processing unit 32b is disposed in an upper layer. The indexer 20 and the interface 50 take a substrate in/out the processor 30, respectively.

The first processing unit 32a includes a first transfer path 34a, a first main robot 36a, and processing modules 40. The first transfer path 34a is longitudinally disposed in the first direction 12 from a position adjacent to the indexer 20 to a position adjacent to the interface 50. The processing modules 40 are disposed at both sides of the first transfer path 34a along a length direction of the first transfer path 34a. The first main robot 36a is disposed in the first transfer path 34a. The first main robot 36a transfers the substrate between the indexer 20, the processing modules 40, and the interface 50.

The second processing unit 32b includes a second transfer path 34b, a second main robot 36b, and processing modules 40. The second transfer path 34b is longitudinally disposed in the first direction 12 from a position adjacent to the indexer 20 to a position adjacent to the interface 50. The processing modules 40 are disposed at both sides of the second transfer path 34b along a length direction of the second transfer path 34b. The second main robot 36b is disposed in the second transfer path 34b. The second main robot 36b transfers the substrate between the indexer 20, the processing modules 40, and the interface 50.

The first processing unit 32a may include modules that perform a coating process, and the second processing unit 32b may include modules that perform a developing process. On the other hand, the first processing unit 32a may include the modules that perform the developing process, and the second processing unit 32b may include the modules that perform the coating process. In addition, the first and second processing units 32a and 32b may include all the modules that perform the coating and the developing processes.

Examples of the modules that perform the coating process may include a module that performs an adhesion process, a module that performs a substrate cooling process, a module that performs a photoresist liquid coating process, and a module that performs a soft bake process. Examples of the modules that perform the developing process may include a module that heats the exposed substrate at a predetermined temperature, a module that cools the substrate, a module that supplies a developer onto the substrate to remove an exposed region or an non-exposed region, and a module that performs a hard bake process.

The indexer 20 is disposed at the front end of the processor 30. The indexer 20 includes load ports 22a, 22b, 22c, and 22d on which a cassette C receiving substrates is disposed and an indexer robot 100a. The load ports 22a, 22b, 22c, and 22d are parallelly disposed in a direction along the second direction 14. The indexer robot 100a is disposed between the load ports 22a, 22b, 22c, and 22d and the processor 30. The cassette C receiving the substrates is disposed on the load ports 22a, 22b, 22c, and 22d by a transfer device (not shown) such as an overhead transfer, an overhead conveyer, or an automatic guided vehicle. The cassette C may include an airtight container such as a front open unified pod (FOUP). The indexer robot 100a transfers the substrates between the load ports 22a, 22b, 22c, and 22d and the processor 30.

The interface 50 is disposed at a rear end of the processor 30 such that the interface 50 and the indexer 20 are symmetrical with respect to the processor 30. The interface 50 includes an interface robot 100b. The interface robot 100b transfers the substrates between an exposure processor 60 and the processor 30.

The indexer robot 100a includes a horizontal guide 110, a vertical guide 120, and a robot arm 120. The robot arm 120 may be straightly movable in the first direction 12 and be rotatable about a Z-axis. The horizontal guide 110 guides a straight movement of the robot arm 130 along the second direction 14. The vertical guide 120 guides a straight movement of the robot arm 130 along a third direction 16. The robot arm 130 has a structure that may be straightly movable in the second direction 14 along the horizontal guide 110, rotatable about the Z-axis, and moved in the third direction 16. The interface robot 100b has the same structure as the indexer robot 100a.

An operation of semiconductor manufacturing facility 10 including constitutions as described above will now be described. The cassette C receiving the substrates is disposed on the load port 22a of the indexer 20 by an operator or the transfer device (not shown). The indexer robot 100a transfers a substrate from the cassette C disposed on the load port 22a to the first main robot 36a of the first processing unit 32a. The first main robot 36a loads the substrate on each of the processing modules 40 while the first main robot 36a is moved along the first transfer path 34a to perform a coating process. When the substrate is completely treated in the processing modules 40, the treated substrate is unloaded from the processing modules 40. The unloaded substrate is transferred to the interface robot 100b by the first main robot 36a. The interface robot 100a transfers the substrate to the exposure processor 60. When the exposing process is completely performed on the substrate, the substrate is transferred to the second processing unit 32b by the interface robot 100b. The substrate is transferred to processing modules 40, and then, the developing process is performed on the substrate. When the developing process is completely performed, the substrate is transferred to the indexer 20.

Figure 4:
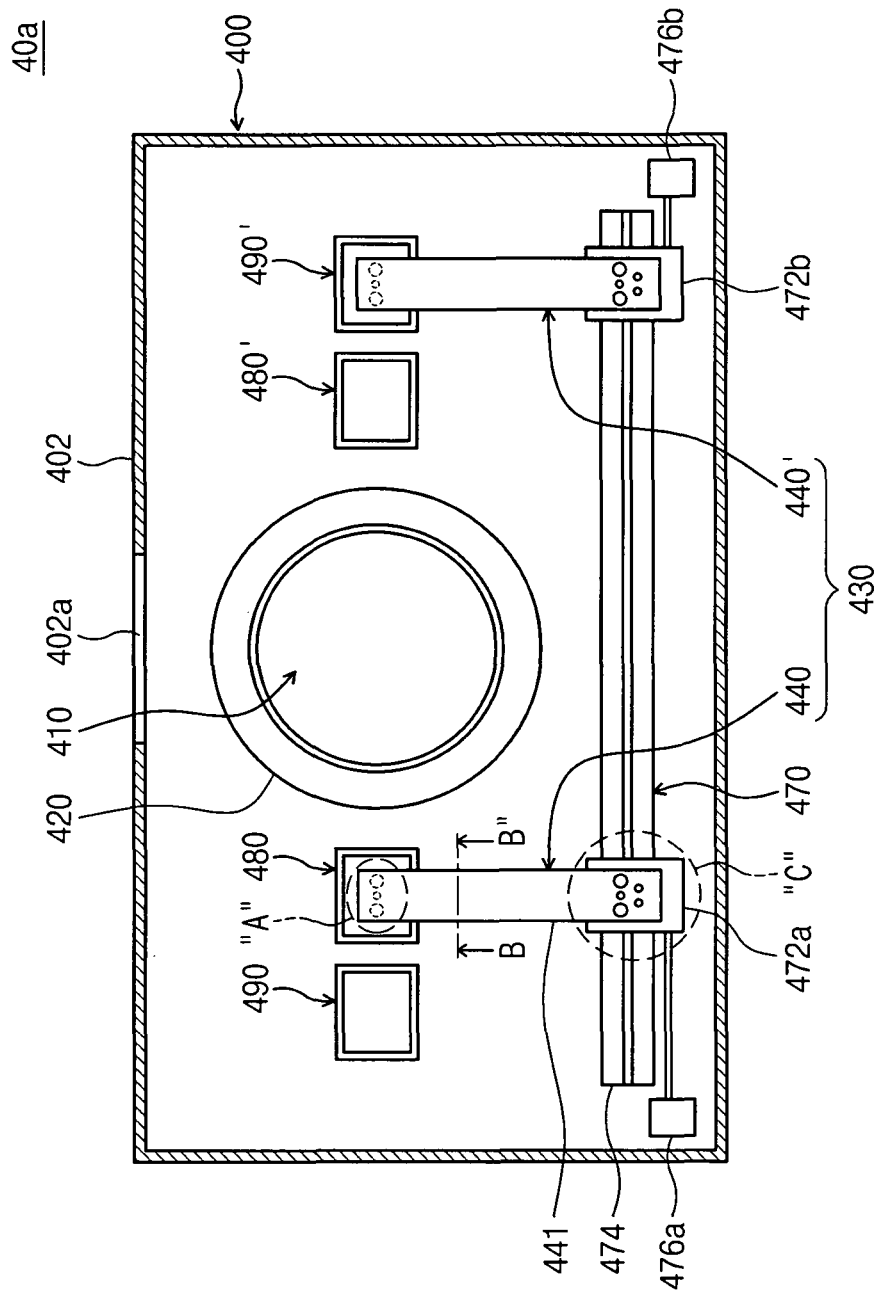
FIG. 4 is a plan view illustrating an example of a substrate treating apparatus according to the present invention.
Figure 5:
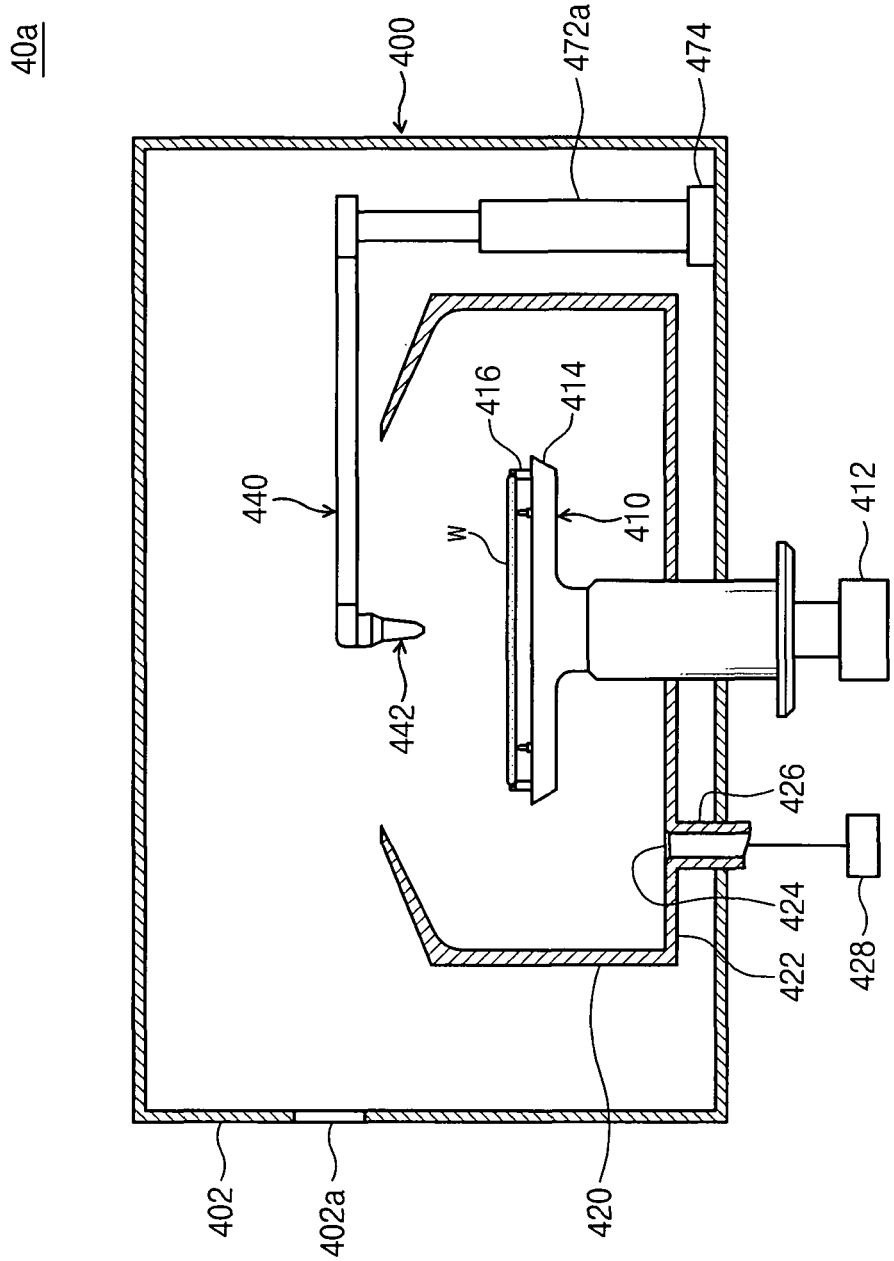
FIG. 5 is a side sectional view illustrating the substrate treating apparatus of FIG. 4.

FIG. 4 is a plan view illustrating an example of a processing module 40a of the processing modules 40, the processing module 40a performing the coating process. FIG. 5 is a side sectional view illustrating the processing module 40a of FIG. 4.

Referring to FIGS. 4 and 5, each of the processing modules 40 includes a processing chamber 400, a substrate support member 410, a chemical liquid supply unit 430, waiting ports 480 and 480', and storage ports 490 and 490'. The processing chamber 400 provides a space in which the substrate treating process is performed. An opening 402a for taking the substrate in/out the processing chamber 400 is formed in sidewalls of the processing chamber 400.

The substrate support member 410 is disposed at a central portion of the processing chamber 400. The substrate support member 410 has one side in which the waiting port 480 and the storage port 490 are disposed and the other side in which the waiting port 480' and the storage port 490'. The waiting ports 480 and 480' may be disposed in a line parallel to the storage ports 490 and 490'.

The substrate support member 410 supports the substrate and may be rotatable. The chemical liquid supply unit 430 supplies a chemical liquid to the substrate disposed on the substrate support member 410 to treat the substrate. The waiting port 480 provides a waiting place in which nozzles 442 of the first and second nozzle arms 440 and 440' wait for performing processes. The storage port 490 provides a storage place in which the nozzles 442 of the first and second nozzle arms 440 and 440' are stored when the nozzles are not used in the processes.

The substrate support member 410 supports a substrate W during processing and is rotated by a rotation driving member such as a motor during processing. The substrate support member 410 includes a support plate 414 having a circular upper surface. Pin members 416 supporting the substrate W are disposed on the upper surface of the support plate 414.

A container 420 is disposed around the substrate support member 410. The container 420 generally has a cylindrical shape, and an exhaust hole 424 is disposed in a lower wall 422 thereof. An exhaust tube 426 is communicated with the exhaust hole 424. An exhaust member 428 such as a pump is connected to the exhaust tube 426. The exhaust member 428 provides a negative pressure to exhaust inner air of the container including the chemical liquid dispersed by the rotation of the substrate W.

The chemical liquid supply unit 430 supplies the chemical liquid onto an upper surface of the substrate W disposed on the substrate support member 410. The chemical liquid supply unit 430 includes the first and second nozzle arms 440 and 440' disposed at both sides of the substrate support member 410. The first nozzle arm 440 and the second nozzle arm 440' are disposed in a direction perpendicular to an arrangement direction of the waiting ports 480 and 480' and the storage ports 490 and 490' that will be described later. The first nozzle arm 440 and the second nozzle arm 440' are straightly moved in a direction parallel to the arrangement direction of the waiting ports 480 and 480' and the storage ports 490 and 490' due to a driving member 470.

The driving member 470 includes arm support members 472a and 472b, a guide member 474, and drivers 476a and 476b. The first nozzle arm 440 has one side coupled to a first nozzle arm support member 472a. The second nozzle arm 440' has one side coupled to a second nozzle arm support member 472b. The first arm support member 472a may have a movable rod shape perpendicular to the first nozzle arm 440. The second arm support member 472b may have a movable rod shape perpendicular to the second nozzle arm 440'. The guide member 474 is connected to lower ends of the first and second arm support members 472a and 472b. The guide member 474 is disposed at a side of the substrate support member 410 so that the guide member 474 is parallel to an arrangement direction of the waiting ports 480 and 480' and the storage ports 490 and 490'. The guide member 474 may have a guide rail shape. The guide member 474 guides the straight movement of the first and second nozzle arm support members 472a and 472b. A first driver 476a is connected to the first nozzle arm support member 472a to straightly move the first nozzle arm support member 472a. A second driver 476b is connected to the second nozzle arm support member 472b to straightly move the second nozzle arm support member 472b. A vertical reciprocating mechanism such as a cylinder may be used as the first and second drivers 476a and 476b. Also, an assembly including a combination of a motor and a gear may be used as the first and second drivers 476a and 476b.

The first and second drivers 476a and 476b straightly move the first and second nozzle arm support members 472a and 472b along the guide member 474. Thus, the first and second nozzles arms 440 and 440' are moved in a straight direction. Since the first and second drivers 476a and 476b are separately disposed, the first and second nozzle arms 440 and 440' may be separately moved in the straight direction. Also, the first and second nozzle arm support members 472a and 472b may be straightly moved in a vertical direction due to a driving member (not shown).

According to the constitution described above, the first and second nozzle arms 440 and 440' may be moved between a processing position of the substrate support member 410, waiting positions of the waiting ports 480 and 480', or storage positions of the storage ports 490 and 490'.

Figure 6:
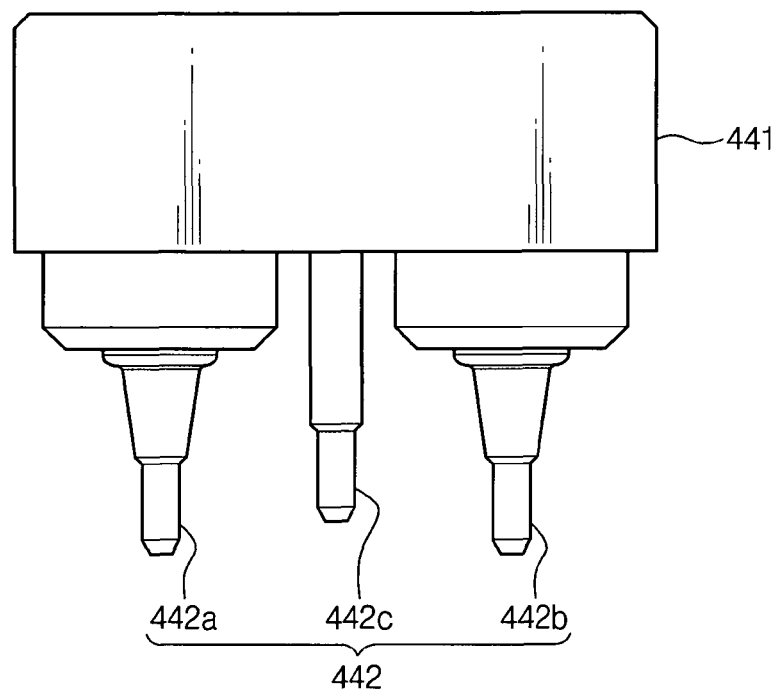
FIG. 6 is an enlarged view illustrating a portion "A" of a first nozzle arm of FIG. 4.
Figure 7:
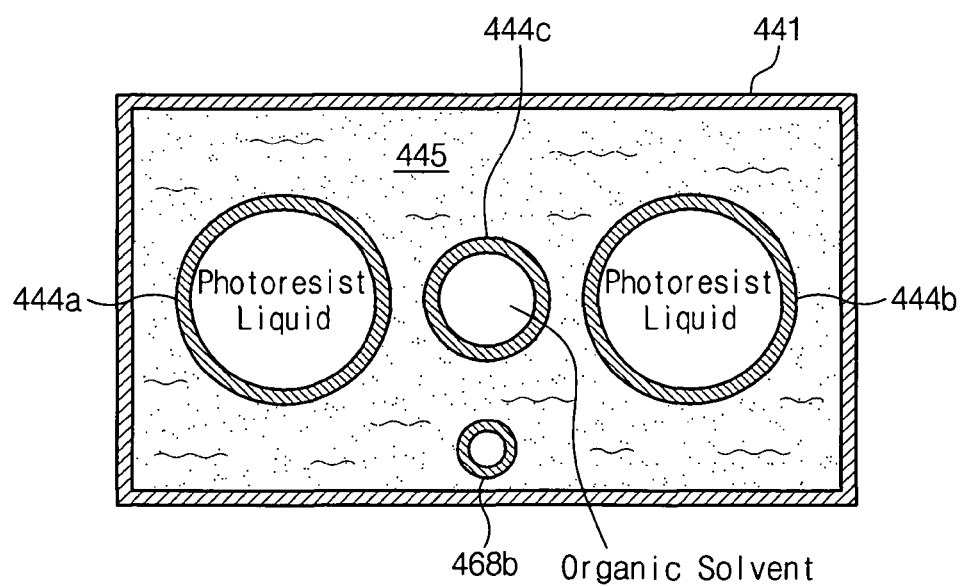
FIG. 7 is a sectional view taken along line B-B' of FIG. 4.
Figure 8:
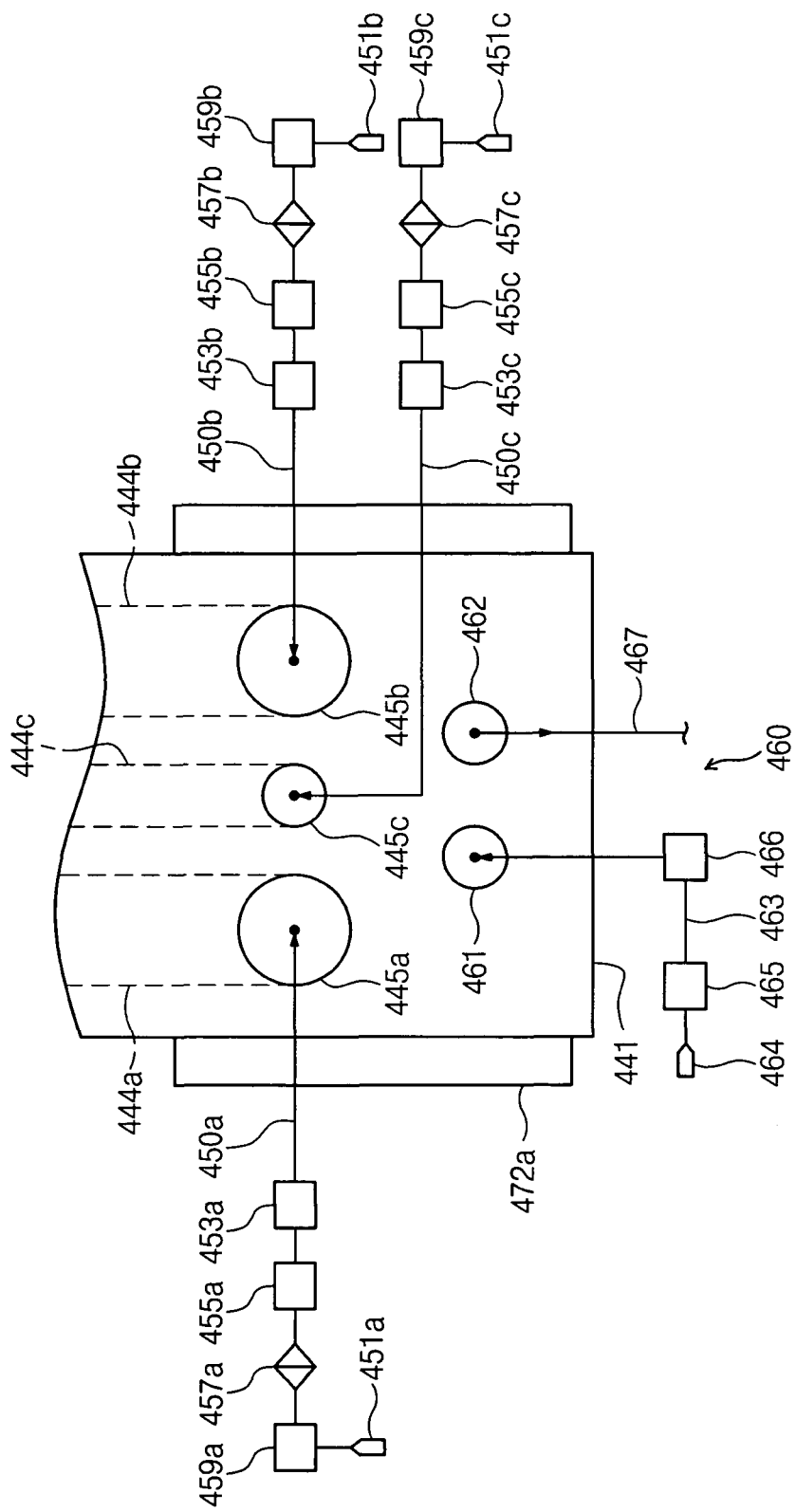
FIG. 8 is an enlarged view illustrating a portion "C" of FIG. 4.

FIG. 6 is an enlarged view illustrating a portion "A" of the first nozzle arm 440 of FIG. 4, FIG. 7 is a sectional view taken along line B-B' of FIG. 4, and FIG. 8 is an enlarged view illustrating a portion "C" of FIG. 4.

The first nozzle arm 440 may have the same constitution as the second nozzle arm 440'. The first nozzle arm 440 will now be described, and a detailed description of the second nozzle arm 440' will be omitted.

Referring to FIGS. 6 through 8, the first nozzle arm 440 includes a hollowed body 441 having a rod shape long in a side direction. The body 441 has one end coupled to the first nozzle arm support member 472a and the other end in which a plurality of nozzles 442 discharging the chemical liquid onto the substrate is vertically disposed. The nozzles may include photoresist liquid nozzles 442a and 442b discharging the chemical liquid onto the substrate and an organic solvent nozzle 442c discharging an organic solvent onto the substrate. The organic solvent nozzle 442c may be disposed in a central portion of the other end of the body 441, and the photoresist liquid nozzles 442a and 442b may be disposed at both left and right sides of the organic solvent nozzle 442c, respectively. Although two photoresist liquid nozzles 442a and 442b are provided in FIG. 6, the present invent is not limited thereto. For example, a plurality of two or more photoresist liquid nozzles 442a and 442b may be provided. Also, the organic solvent nozzle 442c may be not disposed in the first nozzle arm 440 and disposed as an independent structure separated from the photoresist liquid nozzles 442a and 442b.

The organic solvent nozzle 442c is used for performing a pre-wet process before the photoresist liquid coating process using the photoresist liquid nozzles 442a and the 442b is performed. The pre-wet process is a process for coating the organic solvent such as a thinner on the substrate to increase wettability of the photoresist liquid with respect to the substrate before the photoresist liquid is discharged onto the substrate. When the pre-wet process is performed before the coating process is performed, the photoresist liquid may be uniformly spread onto the substrate to form a uniform photoresist film on the substrate.

Chemical liquid tubes 444 are built inside the body 441. The chemical liquid tubes 444 include photoresist liquid tubes 444a and 444b and an organic solvent tube 444c. The photoresist liquid tubes 444a and 444b and the organic solvent tube 444c are disposed inside the body 441 along a length direction of the body 441. The photoresist liquid tube 444a has one end connected to the photoresist liquid nozzle 442a and the other end connected to a photoresist liquid inflow port 445a that will be described later. The photoresist liquid tube 444b has one end connected to the photoresist liquid nozzle 442b and the other end connected to a photoresist liquid inflow port 445b that will be described later. The organic solvent tube 444c has one end connected to the organic solvent nozzle 442a and the other end connected to an organic solvent inflow port 445c that will be described later.

Referring to FIG. 8, the photoresist liquid inflow ports 445a and 445b and the organic solvent inflow port 445c are disposed at one end of the body 441 coupled to the first nozzle arm support member 472a. The photoresist liquid inflow ports 445a and the 445b provide passages through which the photoresist liquid flows into the photoresist liquid tubes 444a and 444b. The organic solvent inflow port 445c provides a passage through which the organic solvent flows into the organic solvent tube 444c.

The photoresist liquid tubes 444a and 444b built in the body 441 have the other ends connected to the photoresist liquid inflow ports 445a and 445b, respectively. Photoresist liquid supply lines 450a and 450b have one ends connected to the photoresist liquid inflow ports 445a and 445b and the other ends connected to photoresist liquid supply sources 451a and 451b, respectively. First suction members 453a and 453b, air operation valves 455a and 455b, filters 457a and 457b, and pumps 459a and 459b are disposed on the photoresist liquid supply lines 450a and 450b in order.

Figure 9:
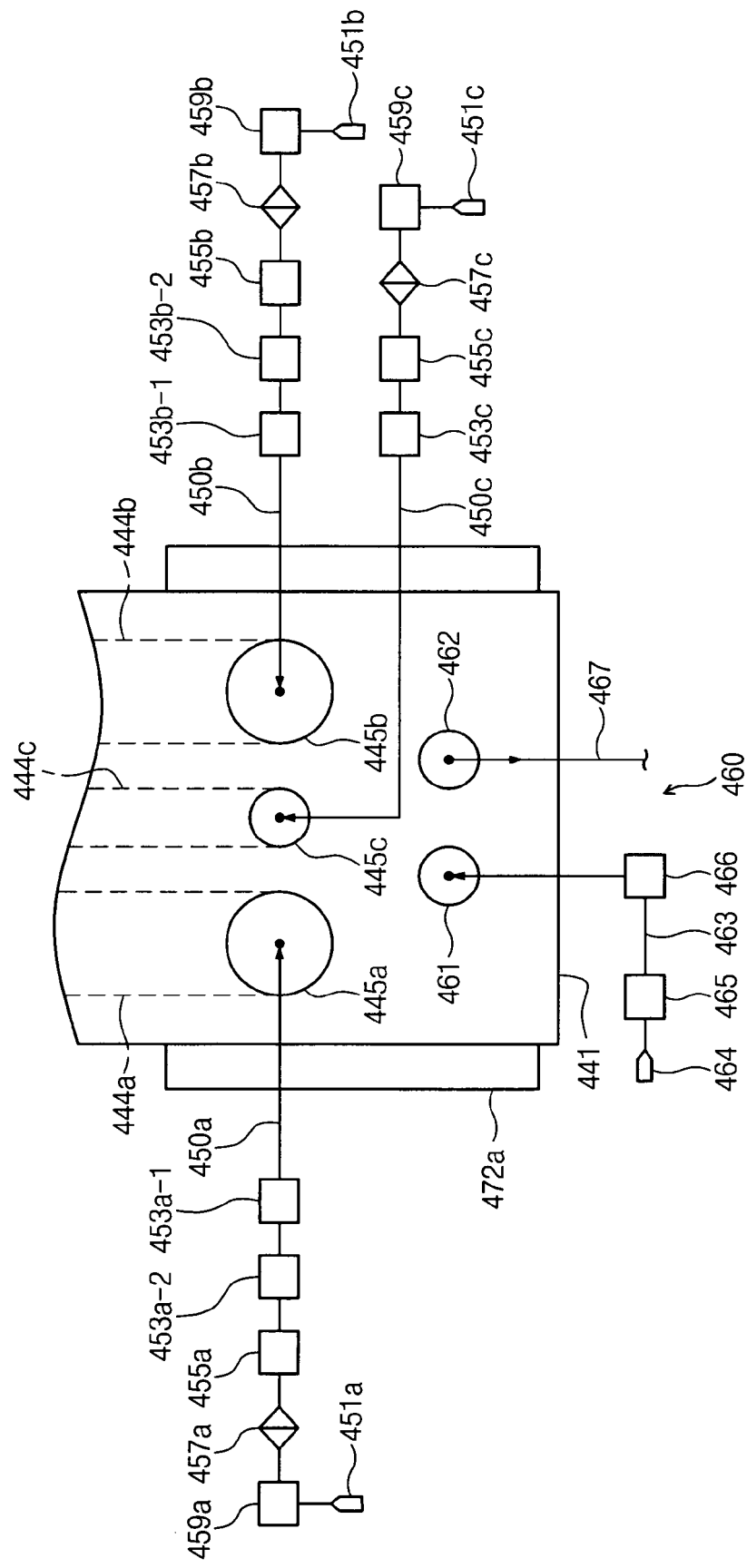
FIG. 9 is a view illustrating a modified example of a constitution illustrated in FIG. 8.

The first suction members 453a and 453b discharge the photoresist liquid onto the substrate through the photoresist liquid nozzles 442a and 442b and provide the negative pressure to the photoresist liquid nozzles 442a and 442b to move the photoresist liquid in a direction reverse to a discharging direction. A suckback valve may be used for the first suction members 453a and 453b. A suckback valve having a motor driving type that can perform a sequential multilevel suction operation may be used. Also, a suckback valve having an air driving type may be used. Since the air driving type suckback valve can perform a suction operation once, air driving type suckback valves 453a-1, 453a-2, 453b-1, and 453b-2 must be disposed in two positions of the photoresist liquid supply lines 450a and 450b for performing the multilevel suction operation as illustrated in FIG. 9.

The air operation valves 455a and 455b are valves for opening and closing the photoresist liquid supply lines 450a and 450b through which the photoresist liquid flows. The filters 457a and 457b filter the photoresist liquid flowing through the photoresist liquid supply lines 450a and 450b. A bellows pump including an elastic bellows or a tubephragm pump including a tubephragm that is constricted by hydraulic fluid to discharge the photoresist liquid may be used for the pumps 459a and 459b.

The organic solvent tube 444c built in the body 441 has the other end connected to the organic solvent inflow port 445c. An organic solvent supply line 450c has one end connected to the organic solvent inflow port 445c and the other end connected to an organic solvent supply source 451c. A second suction member 453c, an air operation valve 455c, a filter 457c, and a pump 459c are disposed on the organic solvent supply line 450c in order. The second suction member 453c discharges the organic solvent such as the thinner onto the substrate through the organic solvent nozzle 442c and provide the negative pressure to the organic solvent nozzle 442c to move the organic solvent in a direction reverse to a discharging direction. A suckback valve may be used for the second suction member 442c.

The photoresist liquid discharged onto the substrate through the photoresist liquid nozzles 442a and 442b and the organic solvent discharged onto the substrate through the organic solvent nozzle 442c must be maintained at appropriate processing temperature. Thus, a temperature control member 460 is disposed in the nozzle arms 440 and 440'. The temperature control member 460 supplies a temperature control fluid inside the body 441 of the nozzle arms 440 and 440' to control temperatures of the photoresist liquid flowing through the photoresist liquid tubes 444a and 444b and the organic solvent flowing through the organic solvent tube 444c. The temperatures of the photoresist liquid flowing through the photoresist liquid tubes 444a and 444b and the organic solvent flowing through the organic solvent tube 444c are controlled by the temperature control fluid flowing through the same passage. Constant temperature water may be used for the temperature control fluid.

The temperature control member 460 includes an inflow port 461 and an outflow port 462 disposed in the body 441 of the nozzle arms 440 and 440'. A temperature control fluid discharging tube 468b is inserted into the body 441. The temperature control fluid discharging tube 468b is communicated with a space 445 between the body 441 and the chemical fluid tubes 444a, 444b, and 444c. The temperature control fluid discharging tube 468b is connected to the outflow port 462. The space 445 between the body 441 and the chemical fluid tubes 444a, 444b, and 444c is communicated with the inflow port 461.

The inflow port 461 provides a passage through which the temperature control fluid flows into the body 441 of the nozzle arms 440 and 440'. The outflow port 462 provides a passage through which the temperature control fluid flowing into the body 441 of the nozzle arms 440 and 440' is discharged.

A temperature control fluid supply line 463 has one end connected to the inflow port 461 and the other end connected to a temperature control fluid supply source 464. A heater 465 and a pump 466 may be disposed in the temperature control fluid supply line 463. The heater 465 heats the temperature control fluid supplied from the temperature control fluid source 464 at a previously set temperature. The pump 466 pumps the heated temperature control fluid to supply the temperature control fluid to the inflow port 461.

Referring to FIG. 7, the temperature control fluid supplied into the body 441 of the nozzle arms 440 and 440' through the inflow port 461 flows through a space between the photoresist liquid tubes 444a and 444b and the organic solvent tube 444c and transmits heat to the photoresist liquid flowing through the photoresist liquid tubes 444a and 444b and the organic solvent flowing through the organic solvent tube 444c. Thus, the photoresist liquid flowing through the photoresist liquid tubes 444a and 444b and the organic solvent flowing through the organic solvent tube 444c can be maintained at the previously set temperature.

A temperature control fluid discharging tube 467 is connected to the outflow port 462. The temperature control fluid supplied into the body 441 of the nozzle arms 440 and 440' is discharged into the outside through the outflow port 462 and the temperature control fluid discharging tube 467.

Figure 10:
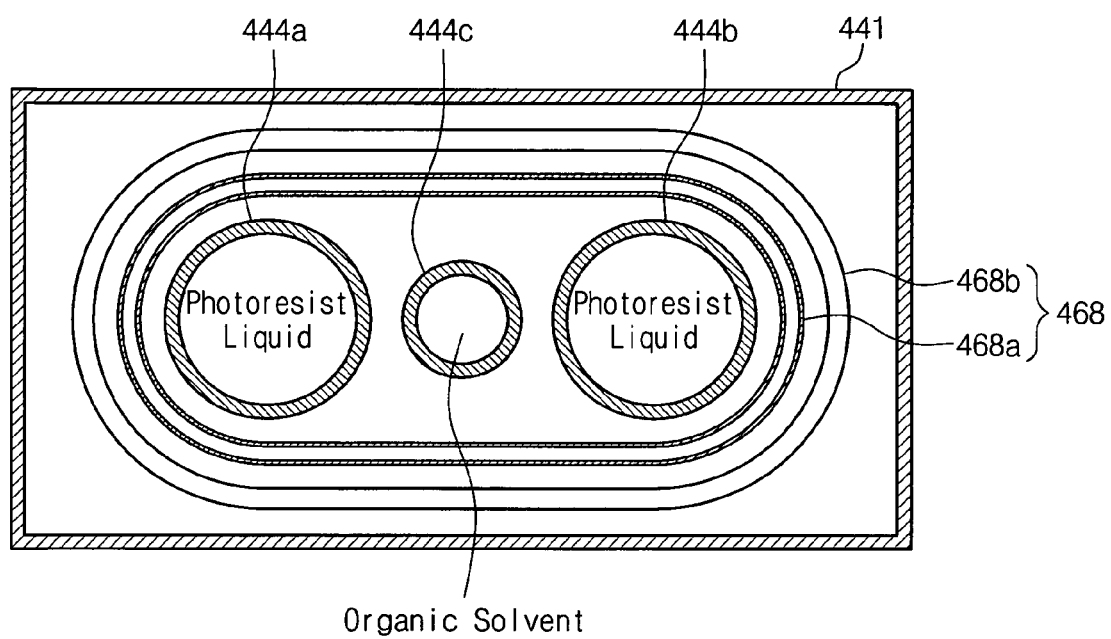
FIG. 10 is a perspective view illustrating another example of a temperature control member of FIG. 8.

Referring to FIG. 10, a circulation tube 468 may be disposed inside a body 441 of nozzles arms 440 and 440' to provide a passage through which a temperature control fluid flows. The circulation tube 468 includes a temperature control fluid supply tube 468a and a temperature control fluid discharging tube 468b. The temperature control fluid supply tube 468a has one end connected to an inflow port 461 and the other end connected to one end of the temperature control fluid discharging tube 468b. The temperature control fluid discharging tube 468b has the other end connected to an outflow port 462. The temperature control fluid supply tube 468a may have a ring shape surrounding chemical liquid tubes 444a, 444b, and 444c. The temperature control fluid discharging tube 468b may have a ring shape surrounding the temperature control fluid supply tube 468a. The temperature control fluid introduced through the inflow port 461 transmits heat to a photoresist liquid and an organic solvent flowing through the chemical liquid tubes 444a, 444b, and 444c while the temperature control fluid flows via the temperature control fluid supply tube 468a and temperature control fluid discharging tube 468b.

In the chemical liquid supply unit and the substrate treating apparatus including the chemical liquid supply unit according to the present invention, the photoresist liquid nozzles and the organic solvent nozzle may be integrated into one nozzle arm. Also, the temperature control fluid can be supplied to the nozzle arm to control the temperatures of the photoresist liquid and the organic solvent, thereby simplifying a facility for controlling the temperatures in the nozzles.

In addition, the chemical liquid supply unit and the substrate treating apparatus including the chemical liquid supply unit according to the present invention can control the temperature of the photoresist liquid as well as the temperature of the organic solvent used in the pre-wet process.

Again referring to FIG. 4, the nozzle arms 440 and 440' including the constitutions described above are used for performing the processes while the nozzle arms 440 and 440' is moved between the waiting positions of the waiting ports 480 and 480' and the processing position of the substrate support member 410. The nozzle arms 440 and 440' are stored in the storage positions of the storage ports 490 and 490' when the nozzle arms 440 and 440' are not used during processing. When the first nozzle arm 440 of the nozzle arms 440 and 440' is used during processing, the second nozzle arm 440' is positioned in the storage position, and the nozzles 442 installed in the second nozzle arm 440' is stored in the storage port 490'. Also, when the second nozzle arm 440' is used during processing, the first nozzle arm 440 is positioned in the storage position, and the nozzles 442 installed in the first nozzle arm 440 is stored in the storage port 490.

Figure 11:
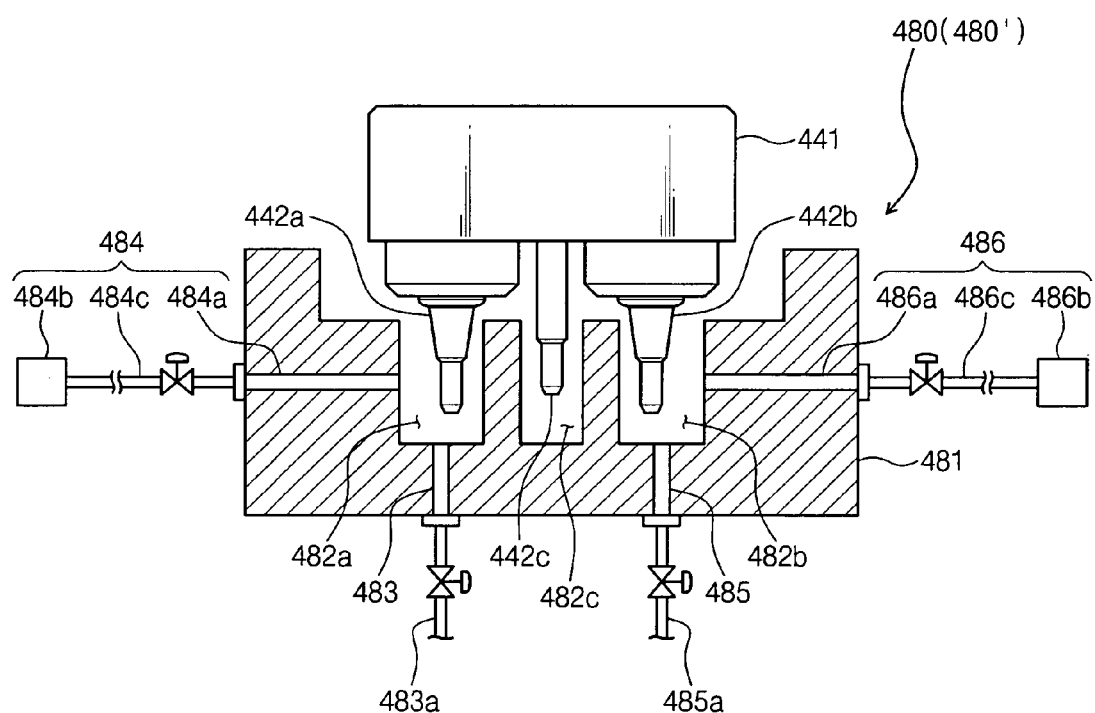
FIG. 11 is a cross-sectional view illustrating an example of a waiting port of FIG. 4.

FIG. 11 is a cross-sectional view illustrating an example of the waiting ports 480 and 480' of FIG. 4.

Referring to FIG. 11, the waiting ports 480 and 480' includes a housing 481 and organic solvent supply members 484 and 486. The housing has an opened top portion and provides a space for receiving nozzles 422a, 422b, and 422c. A plurality of nozzle receiving spaces 482a, 482b, and 482c having a recessed shape is disposed in an inner space of the housing 481 so that the plurality of nozzles 422a, 422b and 422c is separately received. A photoresist liquid nozzle 442a is received in the nozzle receiving space 482a, a photoresist liquid nozzle 442b is received in the nozzle receiving space 482b, and a photoresist liquid nozzle 442c is received in the nozzle receiving space 482c.

Organic solvent supply members 484 and 486 include organic solvent supply passages 484a and 486a. The organic solvent supply passages 484a and 486a are disposed in sidewalls of the housing 481 in contact with the nozzle receiving spaces 482a and 482b for receiving the photoresist liquid nozzles 442a and 442b, respectively. Organic solvent supply lines 484c and 486c connected to organic solvent supply sources 484b and 486b are connected to the organic solvent supply passages 484a and 486a, respectively. Discharging passages 483 and 485 are disposed in a bottom wall of the housing 481 in contact with the nozzle receiving spaces 482a and 482b. Discharging lines 483a and 485a are connected to the discharging passages 483 and 485, respectively. An organic solvent supplied into the nozzle receiving spaces 482a and 482b through the organic solvent supply passages 484a and 486a is discharged through the discharging passages 483 and 485, respectively. A photoresist liquid discharged from the photoresist liquid nozzles 442a and 442b is discharged into the outside through the discharging lines 483a and 485a, respectively.

The organic solvent supply passages 484a and 486a supply the organic solvent to the nozzle receiving spaces 482a and 482b so that the nozzle receiving spaces 482a and 482b are filled to a predetermined liquid surface height. At this time, the organic solvent is sufficiently supplied to the nozzle receiving spaces 482a and 482b until front ends of the photoresist liquid nozzles 442a and 442b are immersed in the organic solvent. The reason in which the front ends of the photoresist liquid nozzles 442a and 442b is in contact with the organic solvent is because the photoresist liquid within the photoresist liquid nozzles 442a and 442b is hardened when the photoresist liquid is exposed to air.

In case where the photoresist liquid nozzle 442a is used during processing, the organic solvent supply passage 484a does not supply the organic solvent to the nozzle receiving space 482a, and the organic solvent supply passage 486b supplies the organic solvent to the nozzle receiving space 482b. This is done because of preventing the photoresist liquid within the photoresist liquid nozzle 442b that is not used during processing from being hardened. There is nothing to worry hardening of the photoresist liquid because the photoresist liquid nozzle 442a used during the processing periodically sprays the photoresist liquid while processing positions and waiting positions of the photoresist liquid nozzle 442a are alternately moved.

Figure 12:
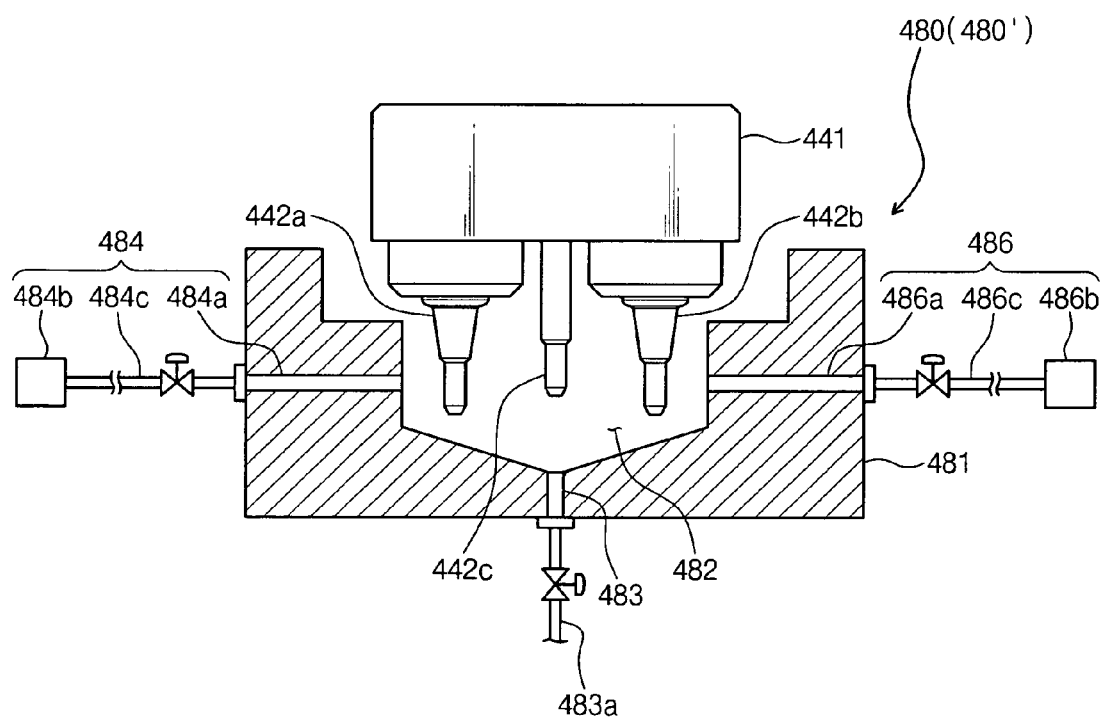
FIG. 12 a cross-sectional view illustrating another example of a waiting port of FIG. 4.

FIG. 12 a cross-sectional view illustrating another example of the waiting ports 480 and 480' of FIG. 4.

Referring to FIG. 12, different from the example of FIG. 11, a nozzle receiving space 482 disposed inside a housing 481 of the waiting ports 480 and 480' may be formed as one space having a recessed shape in which all of a plurality of nozzles 422a, 422b, and 422c can be received. In this case, organic solvent supply passages 484a and 486a are disposed in sidewalls of the housing 481 so that an organic solvent is directly and independently supplied to front ends of photoresist liquid nozzles 442a and 442b. One discharging passage 483 is disposed in a bottom wall of the housing 481.

Figure 13:
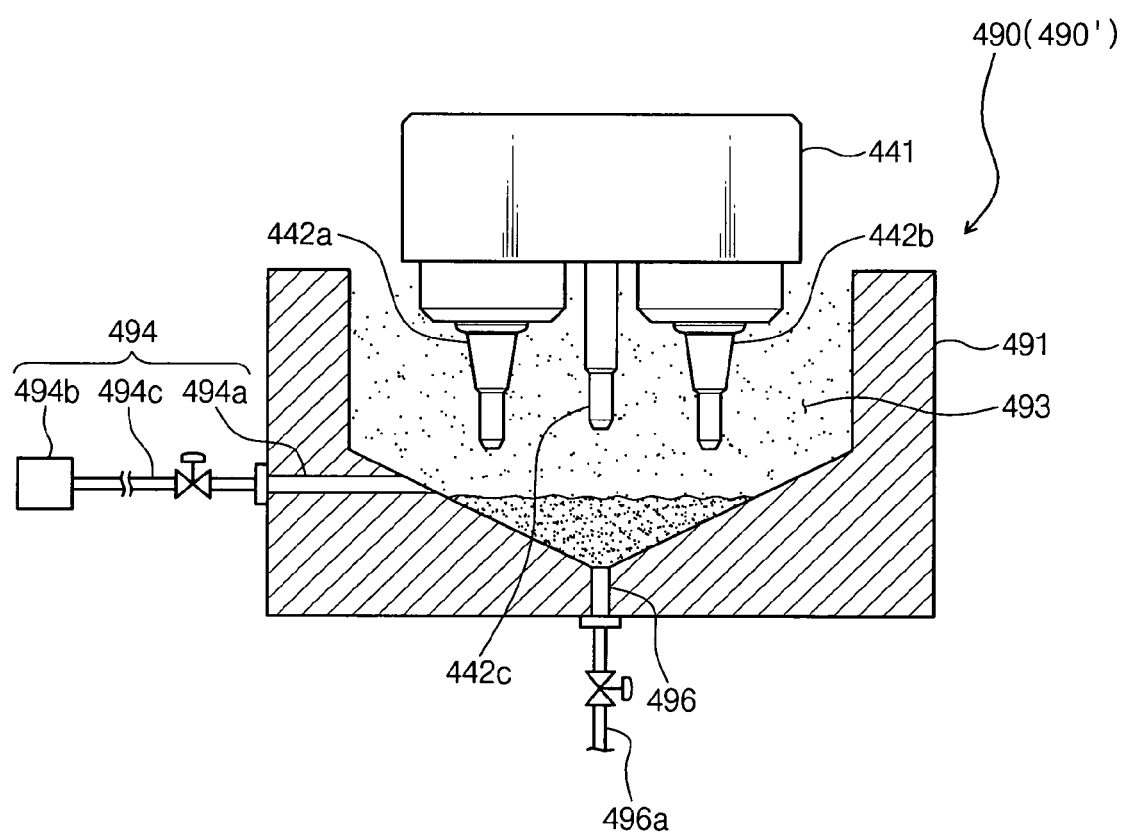
FIG. 13 is a cross-sectional view illustrating an example of a storage port of FIG. 4.

FIG. 13 is a cross-sectional view illustrating an example of the storage ports 490 and 490' of FIG. 4.

Referring to FIG. 13, the storage ports 490 and 490' includes a housing 491 and an organic solvent supply member 494. The housing 491 has an opened top portion and provides a nozzle receiving space 493 for receiving nozzles 422a, 422b, and 422c. The nozzle receiving space may be formed as one space having a recessed shape in which all of the plurality of nozzles 422a, 422b, and 422c can be received. A bottom wall of the housing 491 may have a conic shape in which a lower space of the nozzle receiving space 493 is convex downwardly.

An organic solvent supply member 494 includes an organic solvent supply passage 494a. The organic solvent supply passage 494a is disposed in a sidewall of the housing 491 in contact with the nozzle receiving space 493 for receiving the nozzles 422a, 422b, and 422c. In case where the bottom wall of the housing 491 has the conic shape, the organic solvent supply passage 494a may be disposed in an inclined wall of the bottom wall having the conic shape. Preferably, an organic solvent discharged through the organic solvent supply passage 494a is supplied to a lower portion of the nozzle receiving space 493 positioned below the nozzles 422a, 422b, and 422c received in the storage ports 490 and 490'. This is done for a reason that the organic solvent not is directly supplied to the nozzles 422a, 422b, and 422c, but places the nozzles 422a, 422b, and 422c in an organic solvent atmosphere in a state where the organic solvent is supplied to the lower portion of the nozzle receiving space 493. When the nozzles 422a, 422b, and 422c is placed in the organic solvent atmosphere, it is prevent a photoresist liquid within the photoresist liquid nozzles 442 and 442b from being hardened because the photoresist liquid is not exposed to air.

An organic solvent supply line 494c connected to an organic solvent supply source 494b is connected to the organic solvent supply passage 494a. A discharging passage 496 is disposed in the bottom wall of the housing 491 in contact with the nozzle receiving space 493. A discharging line 496a is connected to the discharging passage 496. The organic solvent supplied into the nozzle receiving space 493 through the organic solvent supply passage 494a is discharged through the discharging passage 496.

A substrate treating method using the substrate treating apparatus including the constitutions as described above will now be described.

Figure 14:
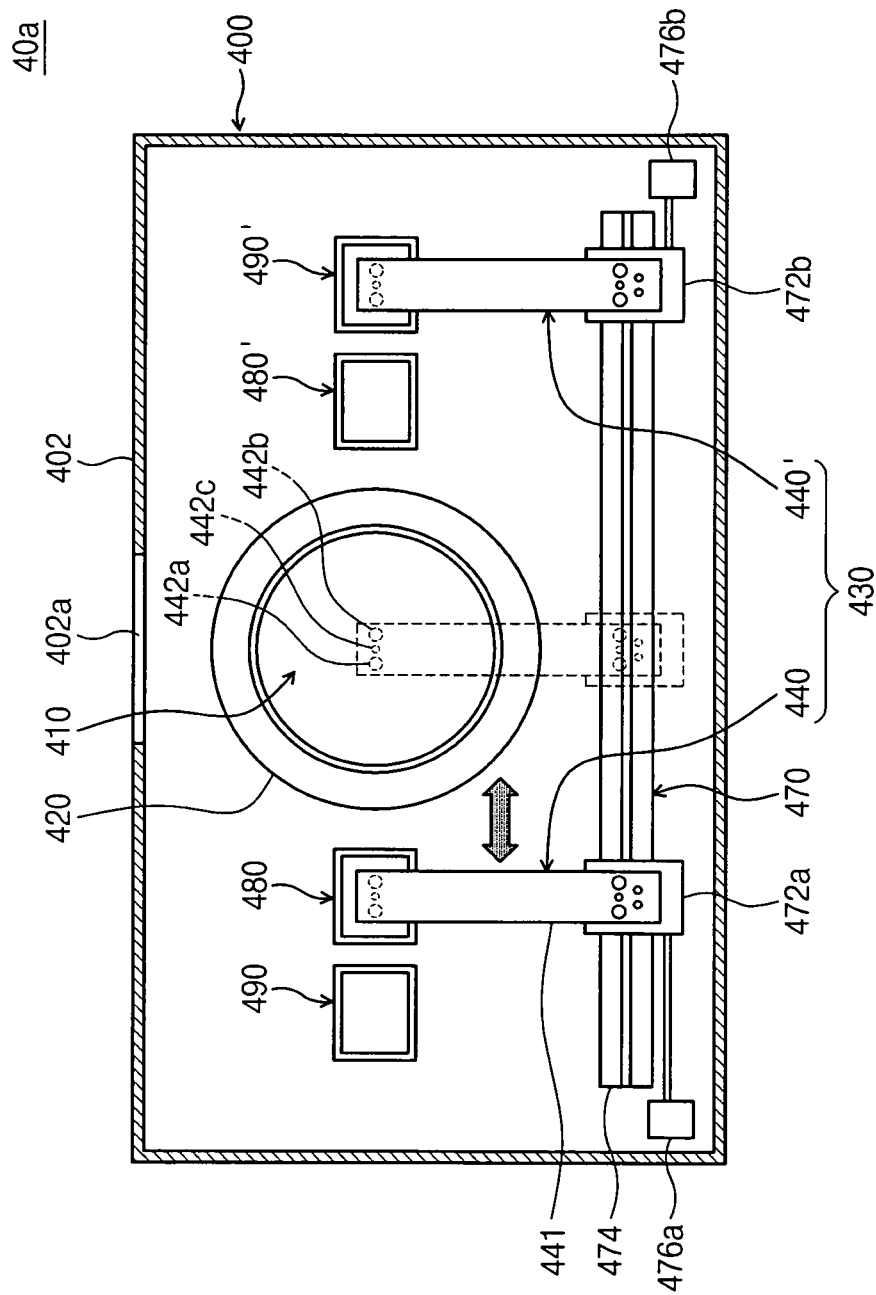
FIG. 14 is a view illustrating an example of an operation state of a substrate treating apparatus according to the present invention.

FIG. 14 is a view illustrating an example of an operation state of a substrate treating apparatus according to the present invention.

Referring to FIG. 14, a substrate W is taken in a processing chamber 400 through an opening 402a of the processing chamber 400. The taken substrate W is placed on a substrate support member 410. Thereafter, a nozzle arm support member 472a including a first nozzle arm 440 is guided by a guide member 474. Thus, the nozzle arm support member 472a is straightly moved to move the first nozzle arm 440 into an upper space of the substrate W. The nozzle arm support member 472a is vertically moved by a driving member (not shown). As a result, the first nozzle arm 440 is vertically moved to dispose nozzles 442 installed in the first nozzle arm 440 at a position which is spaced a predetermined distance from the substrate W disposed on the substrate support member 410 so that the nozzles 442 is maintained at the predetermined distance from the substrate W.

An organic solvent nozzle 442c discharges an organic solvent for performing a pre-wet process onto the substrate W. A rotation driving member (see the reference numeral 412 of FIG. 5) rotates the substrate support member 410 to rotate the substrate W. The organic solvent dispersed by the rotation of the substrate W is discharged through an exhaust tube 426 of a container 420 when the organic solvent is supplied to the substrate W. When the pre-wet process supplying the organic solvent onto the substrate W is completed, the organic solvent within the organic solvent nozzle 442c retreats in a direction reverse to a discharging direction by a suction operation of a suckback valve (see the reference numeral 453c of FIG. 8).

Figure 15:
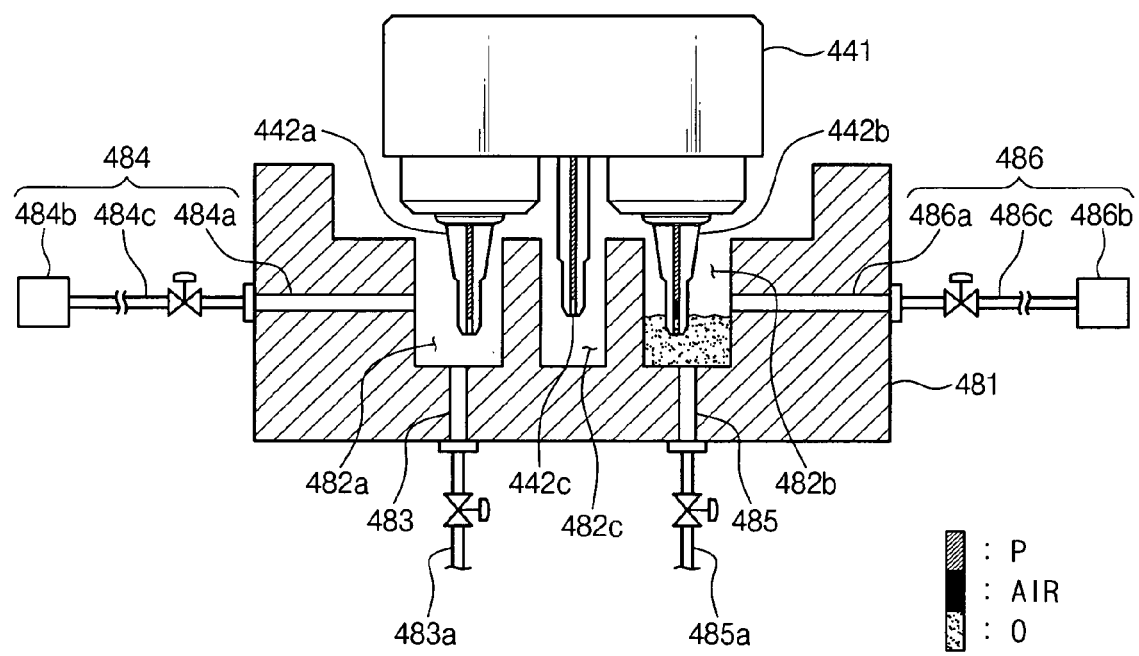
FIGS. 15 and 16 are views illustrating a waiting state of nozzles at a waiting port according to an embodiment of the present invention.

Thereafter, a photoresist liquid is discharged onto the substrate W using one photoresist liquid nozzle 442a of the photoresist liquid nozzles 442a and 442b installed in the first nozzle arm 440. At this time, the substrate W is being rotated. When the photoresist liquid is completely discharged through the photoresist liquid nozzle 442a, the first nozzle arm 440 is moved into a waiting position of a waiting port 480. Referring to FIG. 15, the photoresist liquid nozzles 442a and 442b and the organic solvent nozzle 442c are received in nozzle receiving spaces 482a, 282b, and 482c provided in the waiting port 480, respectively. The photoresist liquid is not filled in the nozzle receiving spaces 482a and 482c, but filled in the nozzle receiving space 482b. The photoresist liquid within the photoresist liquid nozzle 442a discharging the photoresist liquid retreats in a direction reverse to a discharging direction by a suction operation of a first suction member (see the reference numeral 453a of FIG. 8). The photoresist liquid nozzle 442a used in a coating process discharging the photoresist liquid among the nozzles 442a, 442b, and 442c received in the nozzle receiving spaces 482a, 482b, and 482c and the organic solvent nozzle 442c are maintained in a state exposed to air. A front end of the photoresist liquid nozzle 442b that is not used in the photoresist liquid coating process is immersed in the organic solvent. This is done for a reason that it is prevent the photoresist liquid within the photoresist liquid nozzle 442c, which is not used for a predetermined time, from being hardened by direct contacting with the air.

The first nozzle arm 440 waiting in the waiting port 480 is moved again into the processing position of the substrate support member 410. The coating process for coating the photoresist liquid onto the substrate is performed using the photoresist liquid nozzle 442a of the first nozzle arm 440. When the photoresist liquid coating process is completed, the first nozzle arm 440 is moved again to the waiting port 480 to wait in the waiting port 480. At this time, the photoresist liquid nozzle 442a used in the coating process is maintained in a state exposed to air, and the photoresist liquid within the photoresist liquid nozzle 442a retreats in the direction reverse to the discharging direction by the suction operation of the first suction member 453a. Also, the front end of the photoresist liquid nozzle 442b that is not used in the coating process is immersed in the organic solvent.

Figure 16:
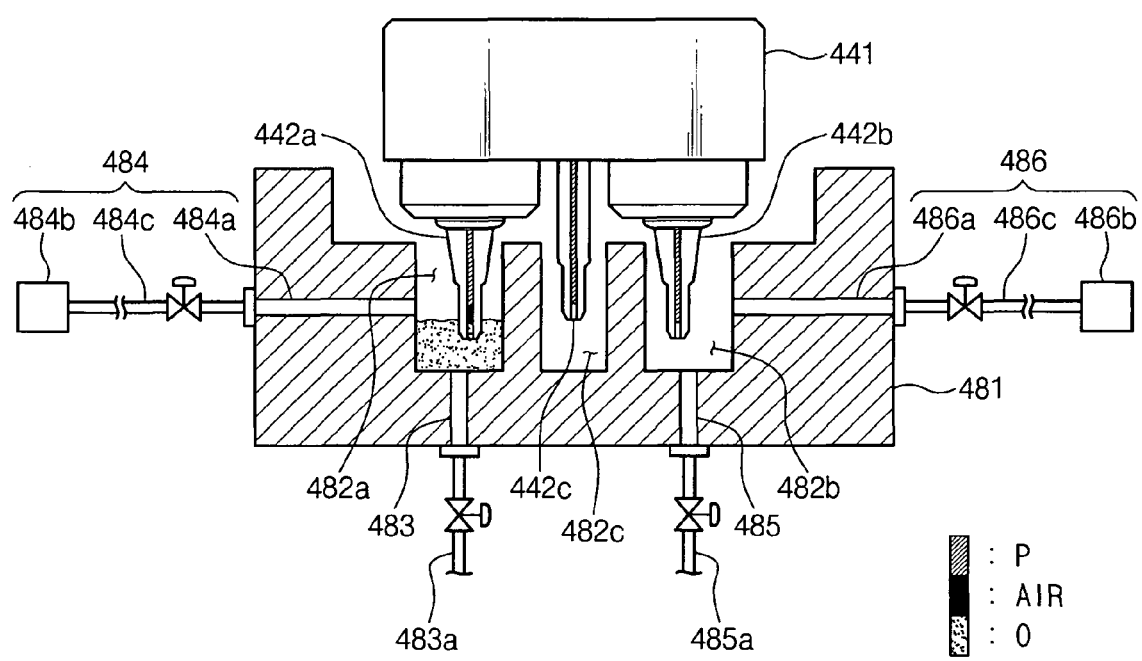

After these operations are repeatedly performed, the photoresist liquid nozzle 442a of the photoresist liquid nozzles 442a and 442b of the first nozzle arm 440 is not used any longer. The coating process is performed using the other photoresist liquid nozzle 442b. Referring to FIG. 16, for performing the coating process using the photoresist liquid nozzle 442b, a photoresist liquid layer P, an air layer AIR, and an organic solvent layer O within the photoresist liquid nozzle 442b must be discharged. The photoresist liquid, the air, and the organic solvent discharged from the photoresist liquid nozzle 442b are discharged to the outside through a discharging passage 485. The organic solvent is filled in the nozzle receiving space 482a, and the front end of the photoresist liquid nozzle 442a that is not used any longer is immersed in the organic solvent. At this time, the photoresist liquid layer P and the air layer AIR within the photoresist liquid nozzle 442a retreat in a direction reverse to a discharging direction by the suction operation of the first suction member 453a, and the organic solvent flows into the front end of the photoresist liquid nozzle 442a to form the organic solvent layer O under the air layer AIR.

The photoresist liquid nozzle 442a is maintained in a state where the photoresist liquid layer P, the air layer AIR, and the organic solvent layer O are formed therein. The photoresist liquid nozzle 442b discharges the photoresist liquid onto the substrate, and the photoresist liquid within the photoresist liquid nozzle 442b retreats in the direction reverse to the discharging direction by the suction operation of the first suction member 453a. The above-described operations are repeatedly performed. When the photoresist liquid nozzle 442b is not used any longer during processing, the photoresist liquid nozzle 442b is maintained in a state where the photoresist liquid layer P, the air layer AIR, and the organic solvent layer O are formed therein by the previously described processes, like the photoresist liquid nozzle 442a.

Figure 17:
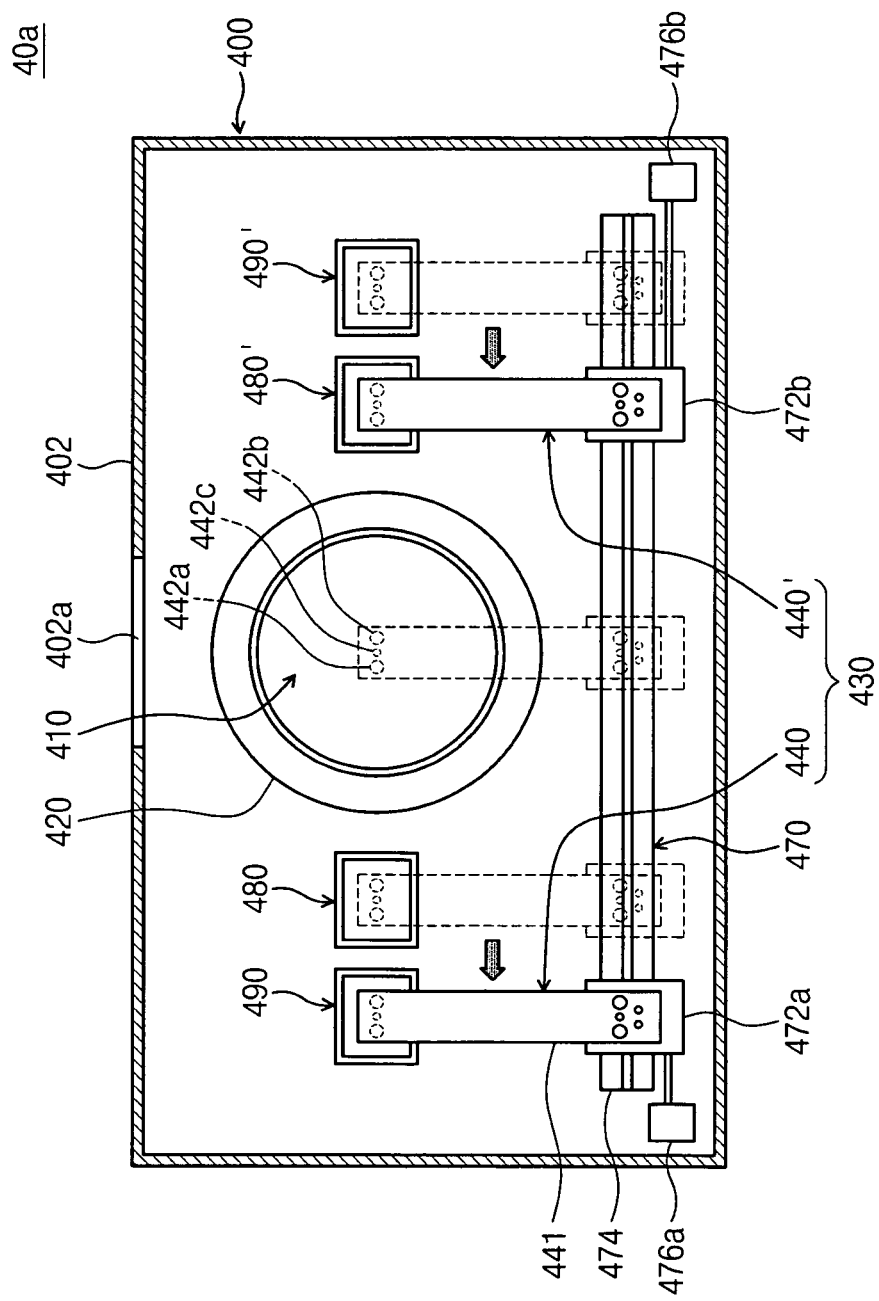
FIG. 17 is a view illustrating another example of an operation state of a substrate treating apparatus according to the present invention.
Figure 18:
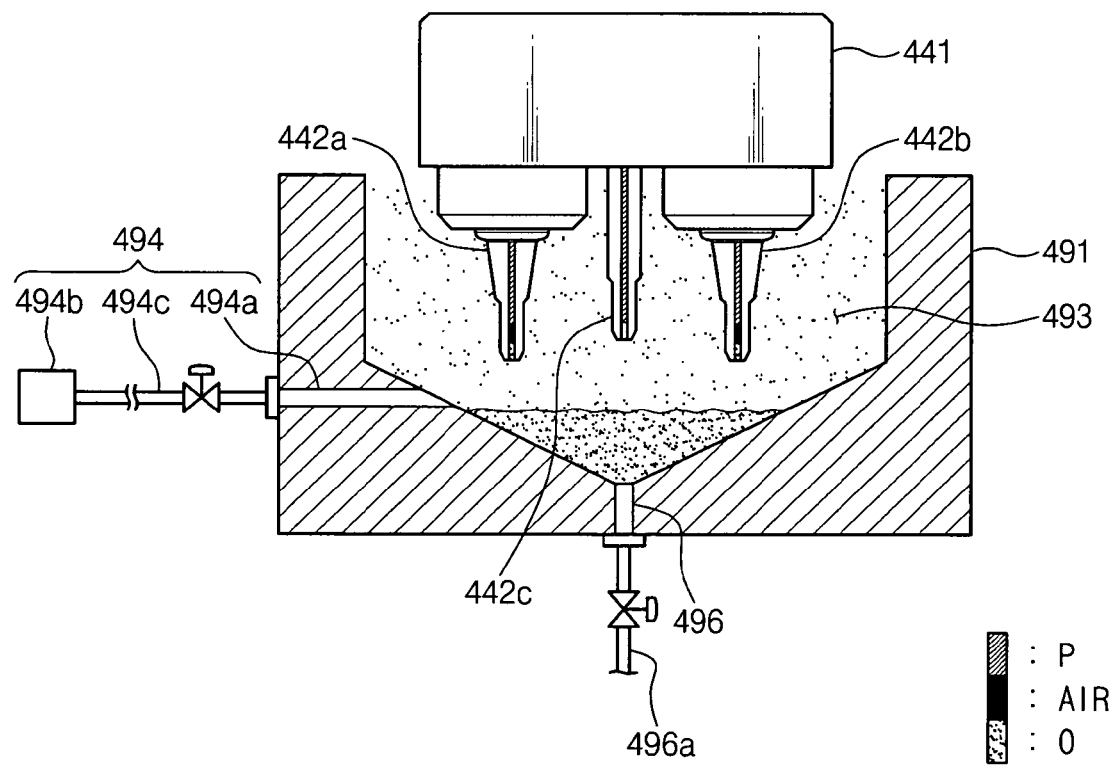
FIG. 18 is a view illustrating a storage state of nozzles at a storage port according to an embodiment of the present invention.

Referring to FIG. 17, when the photoresist liquid nozzles 442a and 442b of the first nozzle arm 440 are not used any longer during processing, the first nozzle arm 440 is moved into the storage position of the storage port 490. Referring to FIG. 18, the photoresist liquid nozzles 442a and 442b installed in the first nozzle arm 440 and the organic solvent nozzle 442c are received in the nozzle receiving space 493 provided in the storage port 490. The organic solvent is supplied to a lower portion of the nozzle receiving space 493 through the organic solvent supply passage 494a, and the organic solvent atmosphere is formed inside the nozzle receiving space 493. At this time, the photoresist liquid nozzles 442a and 442b and the organic solvent nozzle 442c are spaced a predetermined distance from the organic solvent supplied into the nozzle receiving space 493.

As described above, in the chemical liquid supply unit and the substrate treating apparatus including the chemical liquid supply unit according to the present invention, the photoresist liquid nozzles and the organic solvent nozzle can be integrated into one nozzle arm to reduce a processing time according to a select operation of the nozzles during processing.

Although a plurality of photoresist liquid nozzles and one organic solvent nozzle are provided in the nozzle arm, and the fluid flowing into the photoresist liquid nozzles and the organic solvent nozzle is maintained at a predetermined temperature by the temperature control fluid supplied through the same passage in the examples described above, the present invent is not limited thereto. For example, one photoresist liquid nozzle and one organic solvent nozzle may be provided in the nozzle arm, and the fluid flowing into the photoresist liquid nozzle and the organic solvent nozzle may be maintained at a predetermined temperature by the temperature control fluid supplied through the same passage.

Although a local spinner facility that can perform only the coating and developing processes, i.e., a facility to which an exposing system is not connected is explained as one example of the semiconductor manufacturing facility 10 including the substrate treating apparatus according to the present invention, the semiconductor manufacturing facility 10 is not limited thereto. For example, the substrate treating apparatus according to the present invention may be applied to an inline spinner facility that can be connected to the exposing system to sequentially perform the coating, exposing, and developing processes.

According to the present invention, the photoresist liquid can be efficiently supplied onto the substrate.

Also, the chemical liquid discharging nozzles supplying the photoresist liquid can be integrated to reduce the processing time according to the select operation of the nozzles.

Also, the facility for controlling the temperature of the chemical liquid discharging nozzles can be simplified.

Also, the temperature of the organic solvent used in the pre-wet process can be controlled.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate treating apparatus comprising:
  a substrate support member supporting a substrate;
  a nozzle arm including a plurality of nozzles configured to discharge liquid onto the substrate;
  a waiting port configured to receive the plurality of nozzles installed in the nozzle arm when the plurality of nozzles wait for performing processes,
  the waiting port being at a side portion of the substrate support member,
  the waiting port including,
    a first housing having an opened top portion and sidewalls, the first housing providing a nozzle receiving space for receiving the plurality of nozzles, and
    organic solvent supply members that enter the housing through the sidewalls of the housing,
    the organic solvent supply members one-to-one corresponding to the plurality of nozzles received in the housing,
    the organic solvent supply members configured to supply organic solvent to a front end of a nozzle selected from the corresponding nozzles; and
  a storage port configured to provide a recessed space for receiving the plurality of nozzles,
  the storage port being at a side of the waiting port,
  the storage port including,
    a second housing having an opened top portion and a downwardly convex bottom wall defining a recessed region, and
    an organic solvent supply member disposed in an inclined wall of the downwardly convex bottom wall, the organic solvent supply member configured to supply the organic solvent to the recessed space.

2. The substrate treating apparatus of claim 1, further comprising a temperature control member that includes:
  a temperature control fluid discharging tube communicating with a space between an inside wall of a body of the nozzle arm and a plurality of chemical liquid tubes;
  a temperature control fluid supply line configured to supply temperature control fluid to the space between the inside wall of the body and the chemical liquid tubes; and
  a temperature control fluid discharging line connected to the temperature control fluid discharging tube.

3. The substrate treating apparatus of claim 1, wherein the plurality of nozzles includes photoresist liquid nozzles discharging a photoresist liquid, and
  the plurality of chemical liquid tubes include photoresist liquid tubes supplying the photoresist liquid to the photoresist liquid nozzles.

4. The substrate treating apparatus of claim 3, wherein the plurality of nozzles further includes an organic solvent nozzle discharging an organic solvent for performing a pre-wet process, and the plurality of chemical liquid tubes further include an organic solvent tube supplying the organic solvent to the organic solvent nozzle.

5. The substrate treating apparatus of claim 4, wherein the substrate treating apparatus further includes;
an organic solvent supply line connecting an organic solvent source to the organic solvent tube; and
a suction member disposed in the organic solvent supply line, the suction member providing a negative pressure to the organic solvent nozzle.

6. The substrate treating apparatus of claim 1, wherein the plurality of nozzles includes:
photoresist liquid nozzles discharging a photoresist liquid; and
an organic solvent nozzle discharging an organic solvent for performing a pre-wet process.

7. The substrate treating apparatus of claim 3, wherein the first housing provides the nozzle receiving space having a recessed shape in which all of the plurality of photoresist liquid nozzles are received, and
the organic solvent supply members have organic solvent supply passages directly and independently supplying an organic solvent to front ends of the photoresist liquid nozzles.

8. The substrate treating apparatus of claim 7, wherein the nozzle receiving space is a plurality of nozzle receiving spaces having a recessed shape in which the plurality of photoresist liquid nozzles is separately received, and
the organic solvent supply members have organic solvent supply passages independently supplying the organic solvent to each of the nozzle receiving spaces.

9. The substrate treating apparatus of claim 8, wherein the first housing includes a discharging line discharging the organic solvent stored in the nozzle receiving spaces.

10. The substrate treating apparatus of claim 6, wherein the first housing provides a plurality of nozzle receiving spaces having a recessed shape in which the plurality of photoresist liquid nozzles and the organic solvent nozzle are separately received, and
the organic solvent supply members have organic solvent supply passages independently supplying the organic solvent to each of the nozzle receiving spaces receiving the plurality of photoresist liquid nozzles.

11. The substrate treating apparatus of claim 6, wherein the nozzle arm is provided in plurality, and
the waiting port and the storage port are provided in plurality so that each port corresponds to each nozzle arm.

12. The substrate treating apparatus of claim 11, wherein the waiting port and the storage port make a pair, and the pair of ports is separately disposed at both sides of the substrate support member so that the waiting port, the substrate support member, and the storage port are arranged parallel to each other in a line, and
the nozzle arms are separately disposed at both sides of the substrate support member so that the nozzle arms are perpendicular to the arrangement direction of the waiting port and the storage port.

13. The substrate treating apparatus of claim 12, further comprising a driving member moving the nozzle arms configured to position the nozzles provided in the nozzle arm into a processing position on the substrate support member, a waiting position provided in the waiting port, and a storage position provided in the storage port,
wherein the driving member includes:
nozzle arm support members supporting each of the nozzle arms;
drivers straightly reciprocating the nozzle arm support members in a direction parallel to the arrangement direction of the waiting port and the storage port; and
a guide member guiding the straight movement of the nozzle arm support member.

* * * * *